(12) United States Patent
Yoshida et al.

(10) Patent No.: US 7,859,933 B2
(45) Date of Patent: Dec. 28, 2010

(54) SEMICONDUCTOR MEMORY DEVICE AND OPERATING METHOD THEREOF

(75) Inventors: Hiroyasu Yoshida, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 312 days.

(21) Appl. No.: 12/068,691

(22) Filed: Feb. 11, 2008

(65) Prior Publication Data

US 2008/0192558 A1 Aug. 14, 2008

(30) Foreign Application Priority Data

Feb. 13, 2007 (JP) .............................. 2007-031782

(51) Int. Cl.
*G11C 17/18* (2006.01)

(52) U.S. Cl. .................... 365/225.7; 365/200; 365/201; 365/230.03; 365/189.05

(58) Field of Classification Search ................... 365/96, 365/225.7, 200, 201, 230.03, 189.05
See application file for complete search history.

(56) References Cited

U.S. PATENT DOCUMENTS 6,462,998 B1 * 10/2002 Proebsting .................. 365/205
6,967,878 B2 * 11/2005 Dono ......................... 365/200

FOREIGN PATENT DOCUMENTS

JP 03-168998 7/1991
JP 08-297996 11/1996

* cited by examiner

*Primary Examiner*—Tuan T. Nguyen
(74) *Attorney, Agent, or Firm*—Foley & Lardner LLP

(57) ABSTRACT

A semiconductor memory device comprises an anti-fuse, a memory circuit including memory cells, and a peripheral circuit configured to access only an area of the memory circuit selected depending on a state of the anti-fuse.

8 Claims, 7 Drawing Sheets

× : DEFECTIVE BIT

× : DEFECTIVE BIT

× : DEFECTIVE BIT

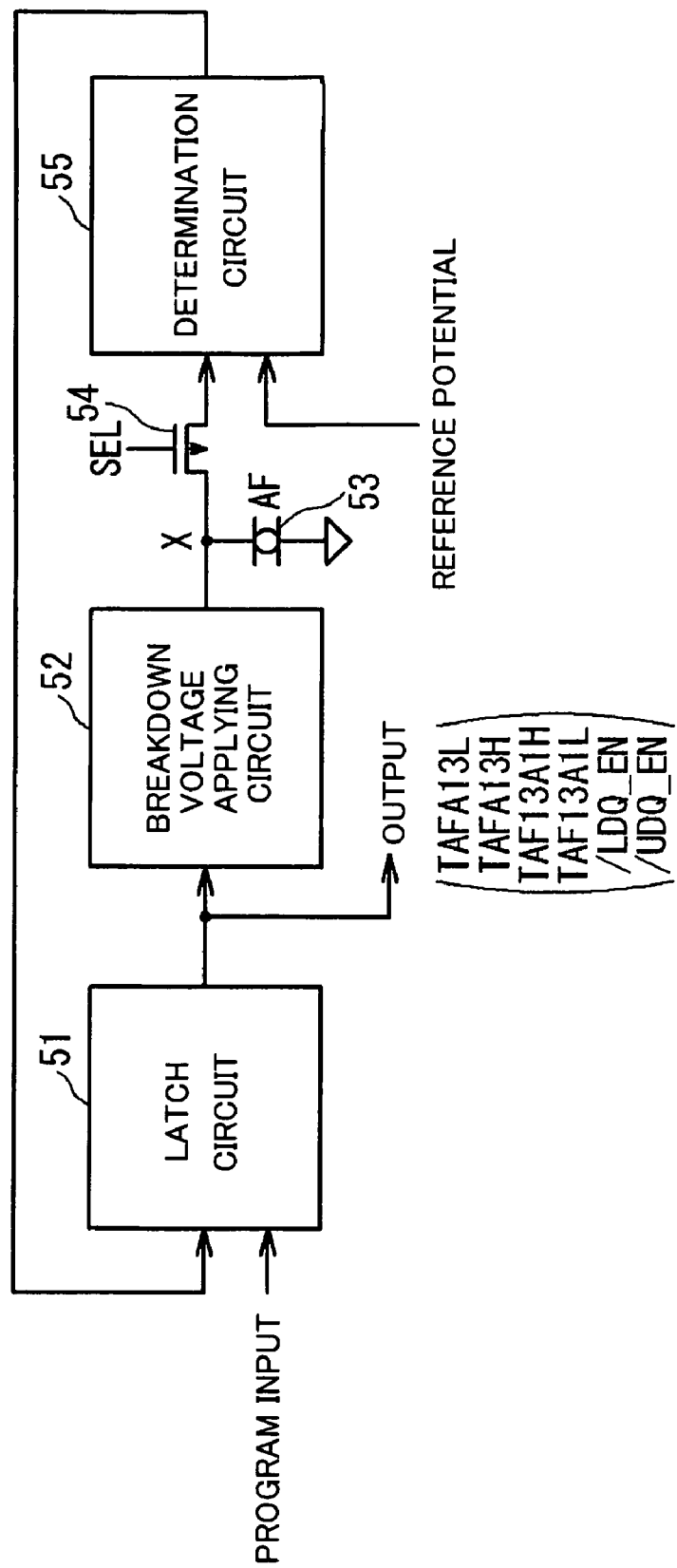

SEMICONDUCTOR MEMORY DEVICE AND OPERATING METHOD THEREOF

BACKGROUND OF THE INVENTION

1. Field of the Invention

The present invention relates to a semiconductor memory device, and particularly relates to a technique of utilizing a defective chip as a partially good chip.

2. Description of the Related Art

As a method for improving yields and thereby providing a semiconductor memory product at low cost, a technique for recovering a defective chip into a partially good chip (see, e.g., Japanese Patent Laid-Open No. Hei 3-168998 and Japanese Patent Laid-Open No. Hei 8-297996) is known. For example, if a chip with a storage capacity of 512 Mbits is detected to be partially defective, it is possible to recover the chip into a chip with a storage capacity of, e.g., 256 Mbits by barring access to a defective part of a memory cell array of the chip.

Known methods for recovering a defective chip into a partially good chip include a method of fixing a value of a part of an internal address. FIGS. 1A and 1B are conceptual diagrams showing examples of the method for recovering the defective chip into the partially good chip by fixing the value of the part of the internal address. In examples in FIGS. 1A and 1B, a semiconductor memory device in which each of four banks are addressed using two bank address bits BA0 and BA1, and a memory cell of each bank is addressed using 13 address bits A0 to A13 serves as an object to be recovered.

For example, if defects are present only in areas of a memory cell array whose uppermost address bit A13 is "0", as shown in FIG. 1A, each uppermost address bit A13 is fixed at "1". This only allows access to the areas whose uppermost address bit A13 is "1", and the semiconductor memory device is recovered into a chip with a half storage capacity. In FIG. 1A, inaccessible areas are hatched. The chip obtained after such recovering is called an "address-based partially good product".

If defects are present only in banks (banks 2 and 3) whose upper bank address bit BA1 is "1", as shown in FIG. 1B, each upper bank address bit BA1 is fixed at "0". This only allows access to banks 0 and 1, and the semiconductor memory device is recovered into a chip with a half storage capacity. In FIG. 1B, inaccessible banks are hatched. The chip obtained after such recovering is called a "bank-based partially good product".

FIG. 2 is a flow chart showing an example of a set of subsequent processes for recovering a defective chip into a partially good chip. First, a first wafer test process is performed (step S01). In the first wafer test process, a wafer for which a preceding process (diffusion process) has been performed is subjected to a probe test. The defective bit is detected by this test.

A trimming process is then performed (step S02). In the trimming process, metal fuses integrated on each chip are trimmed. The metal fuse trimming has two purposes. The first is to perform redundancy relief, which replaces a defective bit with a relief bit. The correspondence between an external address and an internal address is changed by trimming metal fuses prepared for the redundancy relief. With this relief, the defective bit is replaced with the relief bit. The second is to recover a defective chip into a partially good chip. If a defective bit is present outside a range that can be relieved by the redundancy relief, the value of a part of the internal address is fixed by trimming metal fuses prepared separately from ones for the redundancy relief. With this relief, the defective chip is recovered into the partially good chip.

After the trimming process, a second wafer test process is performed (step S03). In the second wafer test process, it is checked whether the defective bit has been correctly relieved by the redundancy relief. After the second wafer test process, each chip is assembled into a package in an assembly process (step S04). The assembled package is tested in a screening test process (step S05). Packages which have been determined to be the good product in the screening test process are shipped.

If it is determined in the second wafer test process that the defective bit to be relieved has not been relieved by the redundancy relief, the defective chip having the defective bit is recovered into the partially good chip when possible. More specifically, the part of the internal address is fixed by bonding the defective chip to a bonding pad which activates a signal for fixing the value of the part of the internal address in the assembly process. With this operation, access to an area including the defective bit is barred, and the defective chip is recovered into the partially good chip.

One problem with the above-described procedure is that recovering of the defective chip into the partially good chip cannot be performed after the assembly process. More specifically, even if the defective bit is detected in the screening test process, the defective chip with the defective bit cannot be recovered into the partially good chip. In the screening test after the assembly process, there is a possibility that the defective bit which has not been detected in the second wafer test process is detected. One reason for the possibility is that both the tests are different in test conditions (e.g., operating speed and test temperature). Another reason is that some bits may become defective due to change in characteristics caused by thermal stress or mechanical stress in the assembly process. A chip with the defective bit detected in the screening test should conventionally be rejected and discarded. This is undesirable from the viewpoint of improving yields and reducing costs. There is a demand for a technique for recovering the defective chip into the partially good chip even after the assembly process.

BRIEF SUMMARY OF THE INVENTION

An object of the present invention is to provide a technique for recovering a defective chip into a partially good chip even after an assembly process.

An aspect of the present invention is a semiconductor memory device, comprising: an anti-fuse; a memory circuit including memory cells; and a peripheral circuit configured to access only an area of said memory circuit selected depending on a state of said anti-fuse.

In the semiconductor memory device of the present invention, said peripheral circuit may include an input buffer for generating an internal address signal based on an external address signal supplied from outside and may select a memory cell to be accessed in said memory circuit in response to the internal address signal, and the input buffer may fix a value of the internal address signal depending on the state of said anti-fuse.

In the semiconductor memory device of the present invention, said memory circuit may include a plurality of banks, said peripheral circuit may include an input buffer for generating an internal bank address signal based on an external bank address signal supplied from outside and may select a bank to be accessed among the plurality of banks in response to the internal bank address signal, and the input buffer may fix a value of the internal bank address signal depending on the state of said anti-fuse.

The semiconductor memory device of the present invention may further comprise a plurality of data input/output terminals, and said peripheral circuit may include: a write/read circuit for sending write data from the plurality of data input/output terminals to said memory circuit and sending read data from said memory circuit to the plurality of data input/output terminals respectively in response to a first control signal and a second control signal; and a switching circuit, a portion of the write/read circuit corresponding to a first data input/output terminal of the plurality of the input/output terminals may operate in response to the first control signal and a portion of the write/read circuit corresponding to a second data input/output terminal of the plurality of the input/output terminals may operate in response to the second control signal, and the switching circuit may fix a value of the first control signal or the second control signal depending on the state of said anti-fuse.

According to the present invention, a technique for recovering a defective chip into a partially good chip even after an assembly process can be provided.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 7 is a block diagram showing an example of a configuration of an anti-fuse circuit.

DETAILED DESCRIPTION OF THE INVENTION

Overall Configuration

Figure 1A:
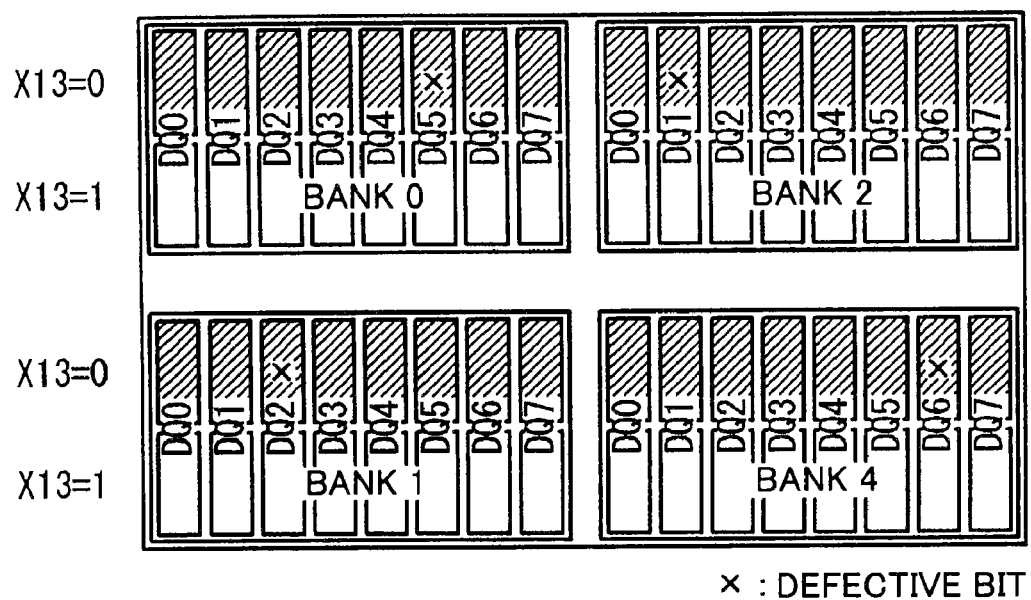
FIG. 1A is a conceptual diagram showing an example of a method for recovering a defective chip into an address-based partially good chip.
Figure 1B:
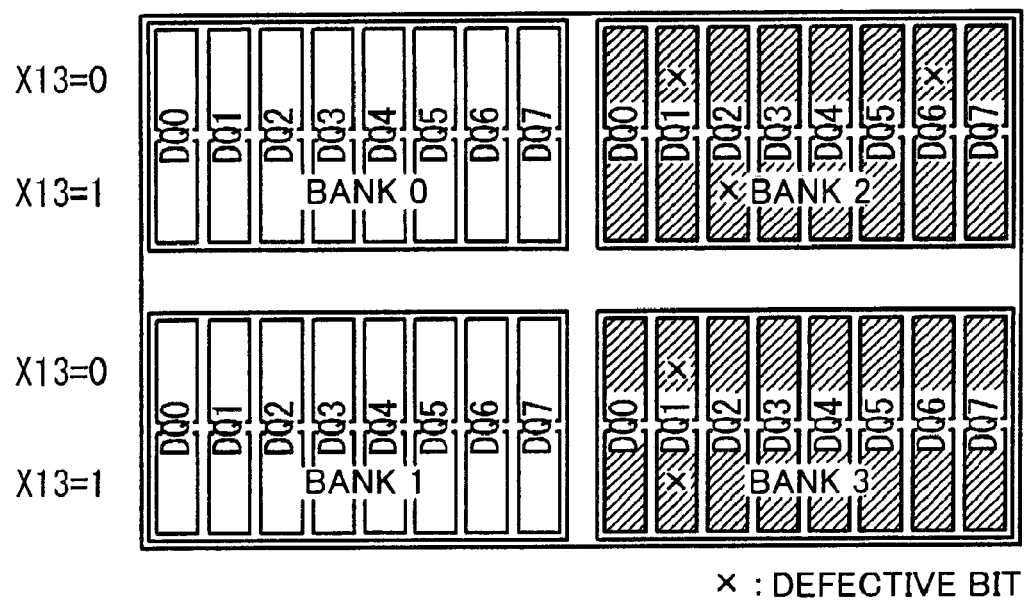
FIG. 1B is a conceptual diagram showing an example of a method for recovering a defective chip into a bank-based partially good chip.
Figure 2:
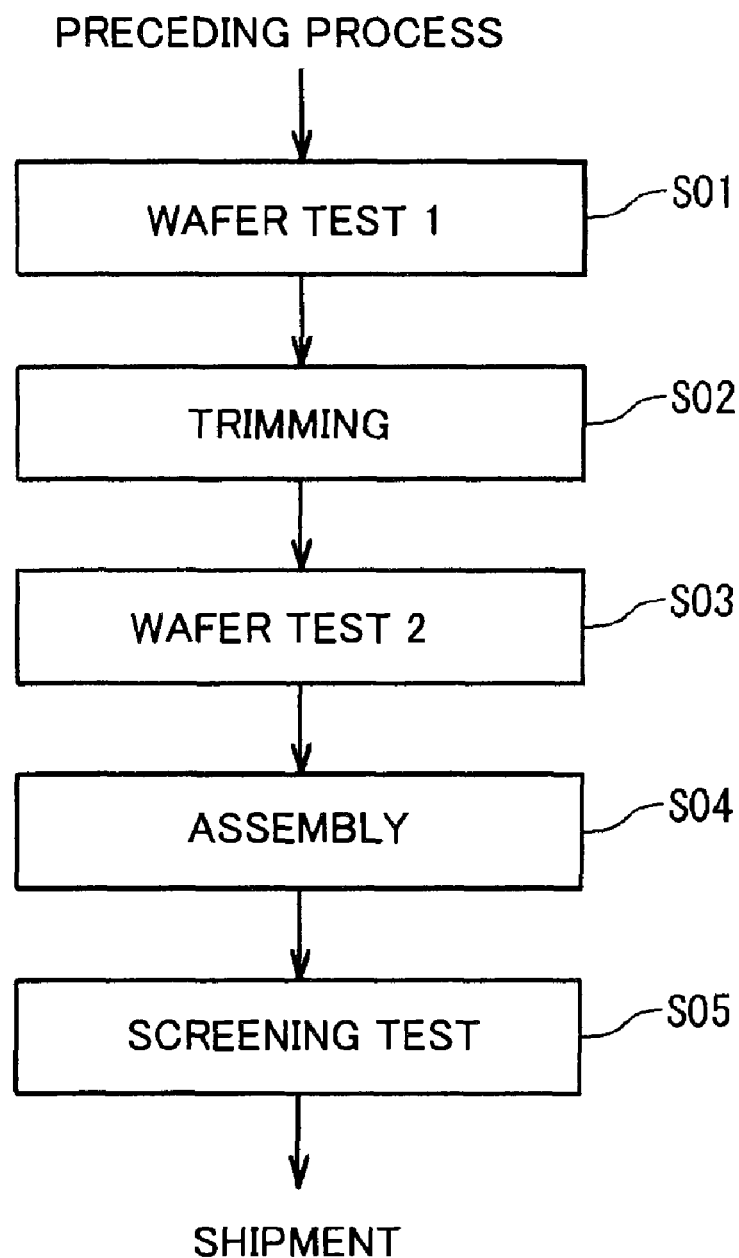
FIG. 2 is a flow chart showing an example of a set of subsequent processes for recovering a defective chip into a partially good chip.
Figure 3:
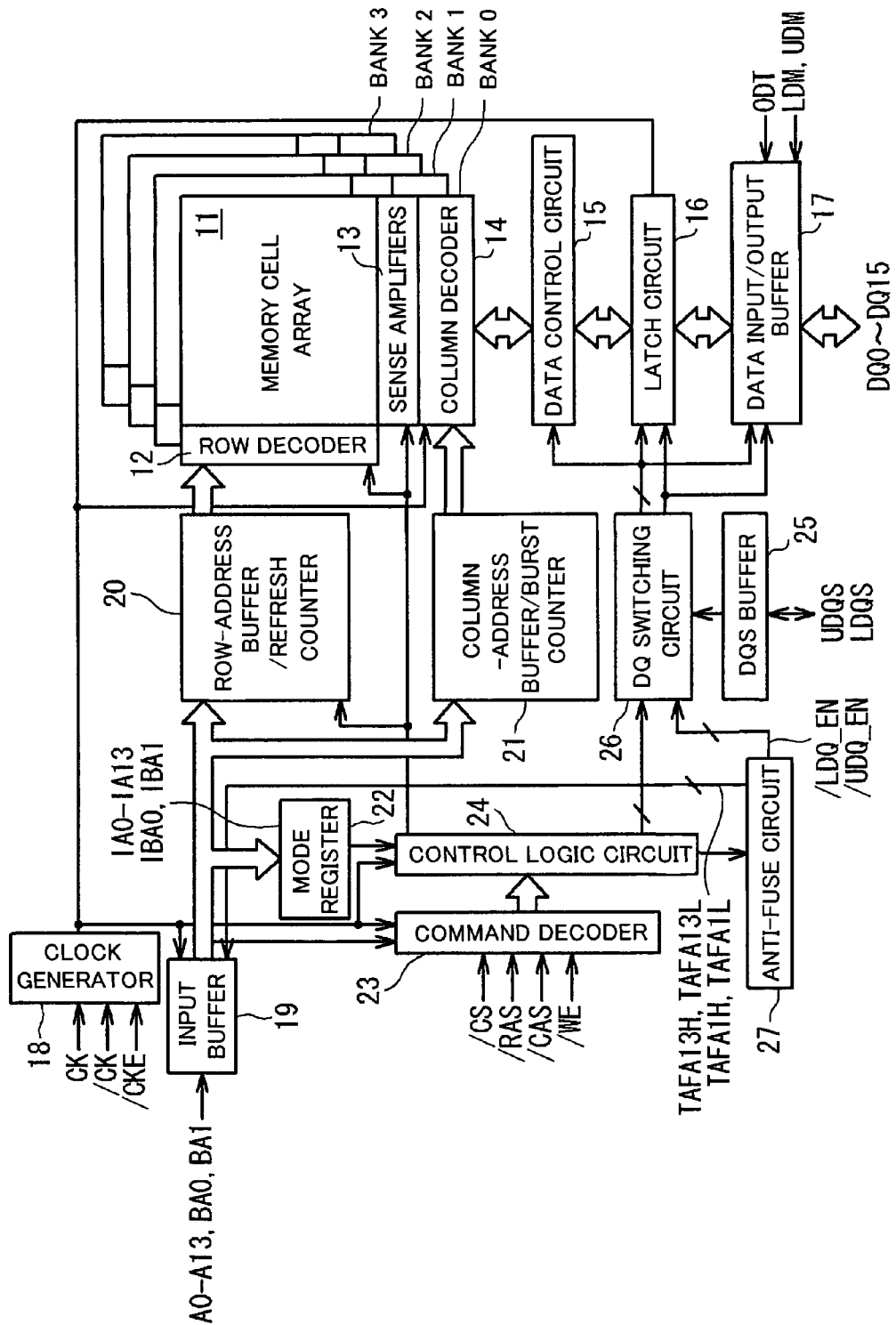
FIG. 3 is a block diagram showing a configuration of a semiconductor memory device according to an embodiment of the present invention.

FIG. 3 is a block diagram showing a configuration of a semiconductor memory device according to an embodiment of the present invention. The semiconductor memory device of this embodiment includes four banks (banks 0 to 3) and is configured to have 16 data input/output terminals DQ0 to DQ15. Each bank includes a memory cell array 11 having memory cells arranged in a matrix, a row decoder 12 which selects a row of the memory cells, sense amplifiers 13, and a column decoder 14 which selects a column of the memory cells. A memory cell to be accessed is selected by the row decoder 12 and the column decoder 14.

Peripheral circuits for accessing banks 0 to 3 include a data control circuit 15, a latch circuit 16, a data input/output buffer 17, a clock generator 18, an input buffer 19, a row-address buffer/refresh counter 20, a column-address buffer/burst counter 21, a mode register 22, a command decoder 23, a control logic circuit 24, a DQS buffer 25, a DQ switching circuit 26, and an anti-fuse circuit 27.

The data control circuit 15, the latch circuit 16 and the data input/output buffer 17 are circuits for inputting and outputting data between the memory cell array 11 of a desired bank and the data input/output terminals DQ0 to DQ15. During a write operation, the data input/output buffer 17 receives write data which is input to the data input/output terminals DQ0 to DQ15, and the latch circuit 16 latches the write data received by the data input/output buffer 17. The data control circuit 15 transfers the write data latched in the latch circuit 16 to the memory cell array 11 of a desired bank. During a read operation, the data control circuit 15 receives read data from the memory cell array 11 of a selected bank, and the latch circuit 16 latches the read data received by the data control circuit 15. The data input/output buffer 17 outputs the read data latched by the latch circuit 16 to the outside through the data input/output terminals DQ0 to DQ15. A lower data mask signal LDM and an upper data mask signal UDM are input to the data input/output buffer 17. The lower data mask signal LDM is a signal for masking lower 8-bit data while the upper data mask signal UDM is a signal for masking upper 8-bit data. As will be described later, the data control circuit 15, the latch circuit 16 and the data input/output buffer 17 are configured to be operable separately for each of the lower data input/output terminals DQ0 to DQ7 and the upper data input/output terminals DQ8 to DQ15.

An on-die termination control signal ODT is further supplied to the data input/output buffer 17. On/off state of an on-die termination in the data input/output buffer 17 is controlled by the on-die termination control signal ODT.

The input buffer 19, the row-address buffer/refresh counter 20 and the column-address buffer/burst counter 21 are circuits for supplying a row address to the row decoder 12 and for supplying a column address and an internal bank address to the column decoder 14 in response to external address signals A0 to A13 and external bank address signals BA0 and BA1.

The input buffer 19 generates internal address signals IA0 to IA13 and internal bank address signals IBA0 and IBA1 from the external address signals A0 to A13 and the external bank address signals BA0 and BA1. The values of the external address signals A0 to A13 supplied to the input buffer 19 and the values of the internal address signals IA0 to IA13 generated by the input buffer 19 are basically the same. Note that the input buffer 19 has a function of fixing some of the internal address signals depending on states of anti-fuses integrated in the anti-fuse circuit 27 and thereby causing the semiconductor memory device of this embodiment to function as an "address-based partially good product". Similarly, the values of the external bank address signals BA0 and BA1 and the values of the internal bank address signals IBA0 and IBA1 are basically the same. The input buffer 19 has a function of fixing some the internal bank address signals depending on states of anti-fuses integrated in the anti-fuse circuit 27 and thereby causing the semiconductor memory device of this embodiment to function as a "bank-based partially good product". The configuration and operation of the input buffer 19 will be described in detail later.

The row-address buffer/refresh counter 20 acquires the row address from the internal address signals IA0 to IA13 and supplies the row address to the row decoder 12 of each bank.

The row decoder 12 selects a row of the memory cell array 11 in response to the row address. The row-address buffer/refresh counter 20 also functions to supply a refresh address to the row decoder 12 during a refresh operation.

The column-address buffer/burst counter 21 acquires the column address from the internal address signals IA0 to IA13 and supplies the column address to the column decoder 14 of each bank. The column-address buffer/burst counter 21 also functions to generate a burst address and to supply it to the column decoder 14 of each bank. The column decoder 14 selects a column of the memory cell array 11 in response to the column address and the burst address. The column decoder 14 of each bank is configured to connect a bit line corresponding to the selected column to the data control circuit 15 when the bank is selected in response to the internal bank address signals IBA0 and IBA1.

The mode register 22, the command decoder 23 and the control logic circuit 24 are circuits used to control the operation of the semiconductor memory device. The mode register 22 extracts setting of operation mode of the semiconductor memory device from the internal address signals IA0 to IA13 and holds it. The command decoder 23 determines an operation command based on a chip select signal /CS, a row-address strobe signal /RAS, a column-address strobe signal /CAS and a write-enable signal /WE, and supplies the operation command to the control logic circuit 24. The control logic circuit 24 generates various control signals for controlling the circuits (e.g., the row-address buffer/refresh counter 20, the row decoder 12, the sense amplifiers 13, the column decoder 14, the data control circuit 15, the latch circuit 16 and the data input/output buffer 17) of the semiconductor memory device in accordance with the setting of the mode register 22 and the operation command designated by the command decoder 23.

The DQS buffer 25 is a buffer for inputting and outputting a lower data strobe signal LDQS and an upper data strobe signal UDQS. The lower data strobe signal LDQS is a signal for synchronizing the data input/output buffer 17 and an external device in terms of the input and output of lower 8-bit data (data corresponding to the data input/output terminals DQ0 to DQ7). The upper data strobe signal UDQS is a signal for synchronizing the data input/output buffer 17 and the external device in terms of the input and output of upper 8-bit data (data corresponding to the data input/output terminals DQ8 to DQ15). During the read operation, the DQS buffer 25 outputs the lower data strobe signal LDQS and the upper data strobe signal UDQS to the external device. During the write operation, the DQS buffer 25 receives the lower data strobe signal LDQS and the upper data strobe signal UDQS from the outside.

Figure 4:
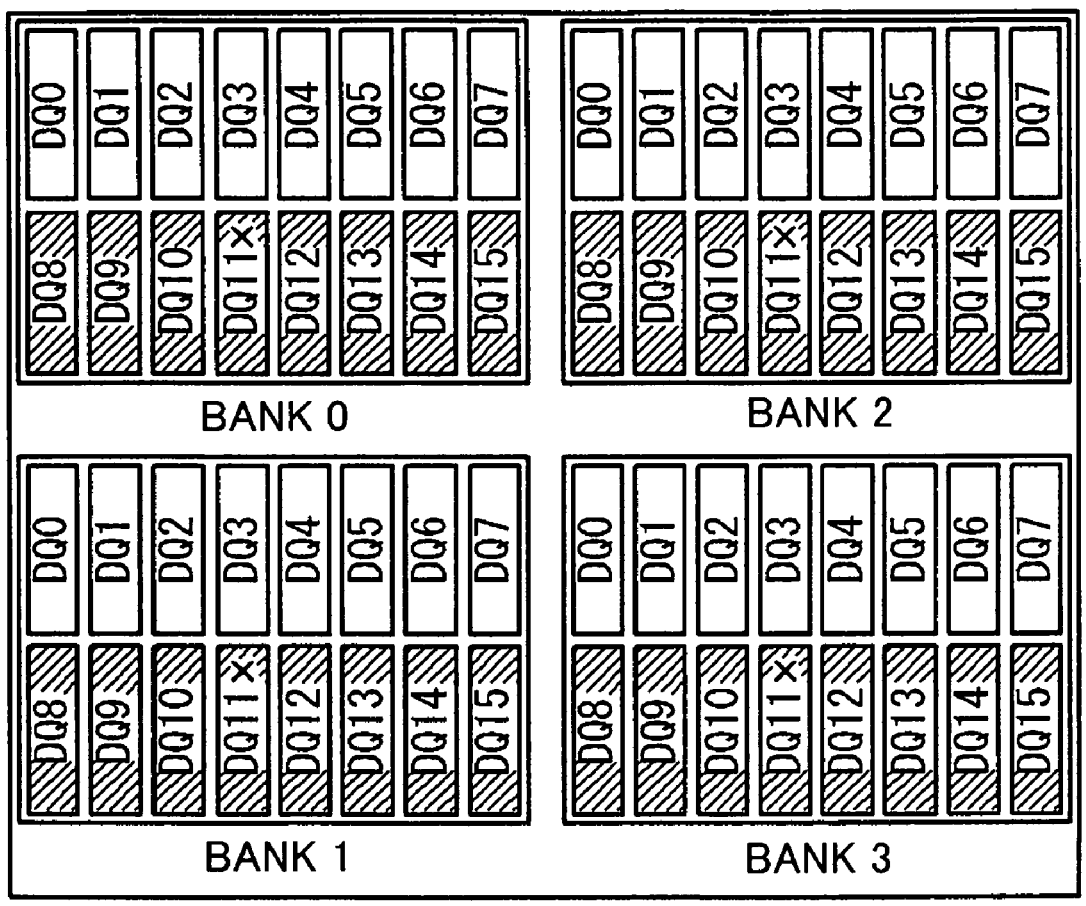
FIG. 4 is a conceptual diagram showing an example of a method for recovering a defective chip into a DQ-based partially good chip.

The DQ switching circuit 26 is a circuit for disabling the lower data input/output terminals DQ0 to DQ7 and the upper data input/output terminals DQ8 to DQ15 depending on the states of anti-fuses integrated in the anti-fuse circuit 27. The function of the DQ switching circuit 26 is to provide a "DQ-based partially good product". The "DQ-based partially good product" is a chip configured to only allow access to a portion corresponding to some of the data input/output terminals, of the memory cell array 11 of each bank, as shown in FIG. 4. The semiconductor memory device of this embodiment can operate as the "DQ-based partially good product" which only allows access to areas corresponding to the data input/output terminals DQ0 to DQ7 or as the "DQ-based partially good product" which only allows access to areas corresponding to the data input/output terminals DQ8 to DQ15, depending on the state of the anti-fuses integrated in the anti-fuse circuit 27.

The configuration and operation of the DQ switching circuit 26 will be described in detail later.

The anti-fuse circuit 27 has the integrated anti-fuses and supplies a control signal with a signal level corresponding to the state of the anti-fuses to the input buffer 19 and the DQ switching circuit 26. The semiconductor memory device of this embodiment functions as the "address-based partially good product", the "bank-based partially good product", or the "DQ-based partially good product", depending on the state of the anti-fuses of the anti-fuse circuit 27.

(Configuration and Operation of Input Buffer)

As described above, the input buffer 19 fixes some of the internal address signals and/or the internal bank address signals depending on the state of the anti-fuses integrated in the anti-fuse circuit 27 and thereby causes the semiconductor memory device of this embodiment to function as the "address-based partially good product" and/or the "bank-based partially good product". In this embodiment, the internal address signal IA13 and/or the internal bank address signal IBA1 are fixed depending on the state of the anti-fuses. The internal address signal IA13 is a signal used to supply the uppermost bit of the row address, and the internal bank address signal IBA1 is a signal used to supply the uppermost bit of the bank address. Values at which the internal address signal IA13 and the internal bank address signal IBA1 are determined depending on the state of the anti-fuses integrated in the anti-fuse circuit 27.

Figure 5:
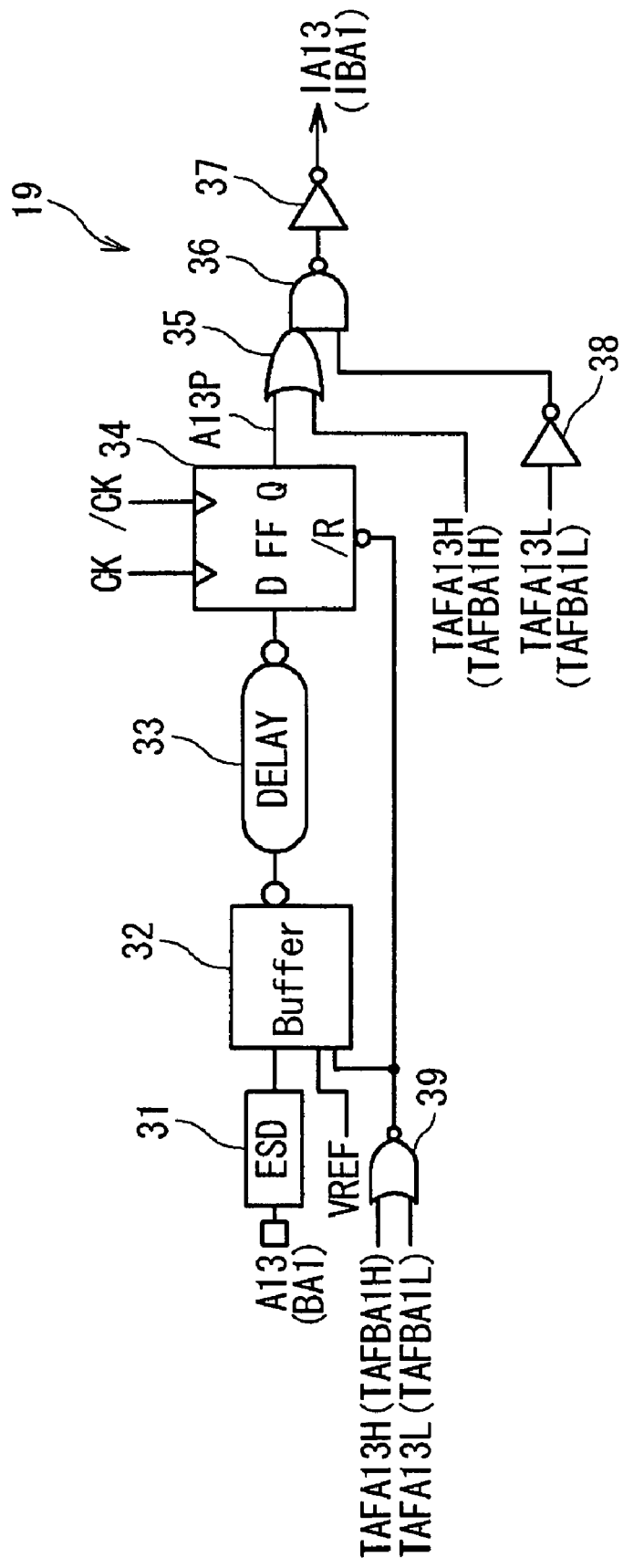
FIG. 5 is a circuit diagram showing a configuration of an input buffer of an embodiment of the present invention.

FIG. 5 is a circuit diagram showing an example of the configuration of a portion for generating the internal address signal IA13 from the external address signal A13, in the input buffer 19. The input buffer 19 includes an ESD protection circuit 31, a buffer 32, a delay circuit 33, a D flip-flop 34, an OR gate 35, a NAND gate 36, inverters 37 and 38, and a NOR gate 39. The input buffer 19 fixes the internal address signal IA13 at "High" or "Low" in response to control signals TAFA13H and TAFA13L. Each of the control signals TAFA13H and TAFA13L is a signal indicating the state of each anti-fuse integrated in the anti-fuse circuit 27. The control signals TAFA13H and TAFA13L are set to "Low" by default. When an anti-fuse corresponding to the control signal TAFA13H is programmed, the control signal TAFA13H is pulled up to "High". Similarly, when an anti-fuse corresponding to the control signal TAFA13L is programmed, the control signal TAFA13L is pulled up to "High". It is prohibited that both the control signals TAFA13H and TAFA13L are set to "High" simultaneously. In the circuit of FIG. 5, the internal address signal IA13 is fixed at "High" when the control signal TAFA13H is "High" and is fixed at "Low" when the control signal TAFA13L is "High".

More specifically, when the control signal TAFA13H or TAFA13L is set to "High" (i.e., the corresponding anti-fuse is programmed), the buffer 32 is cut off, and the D flip-flop 34 is reset. Thereby, an output A13P from the D flip-flop 34 is fixed at "Low". As a result of the output A13P from the D flip-flop 34 being fixed at "Low", the internal address signal IA13 is fixed at "High" when the control signal TAFA13H is "High", and is fixed at "Low" when the control signal TAFA13L is "High".

A portion for generating the internal bank address signal IBA1 from the external bank address signal BA1 in the input buffer 19 is configured in the same manner. Control signals TAFBA1H and TAFBA1L each of which is a signal indicating the state of each anti-fuse integrated in the anti-fuse circuit 27 are supplied to the input buffer 19. The input buffer 19 fixes the internal bank address signal IBA1 at "High" or "Low" in response to the control signals TAFBA1H and TAFBA1L. The input buffer 19 fixes the internal bank address signal IBA1 at "High" when the control signal TAFBA1H is "High", and fixes the internal bank address signal IBA1 at "Low" when the control signal TAFBA1L is "High". It is prohibited that both the control signals TAFBA1H and TAFBA1L are set to "High" simultaneously.

If the semiconductor memory device functions as the "address-based partially good product", the anti-fuse corresponding to the control signal TAFA13H or the anti-fuse corresponding to the control signal TAFA13L is programmed depending on a position of a defective bit. By this, the internal address signal IA13 is fixed at "High" or "Low" and thus the uppermost bit of the row address is fixed at "0" or "1". When the uppermost bit of the row address is fixed at "0", access to areas of each memory cell array 11 whose uppermost address bit is "1" is barred. Similarly, when the uppermost bit of the row address is fixed at "1", access to areas of each memory cell array 11 whose uppermost address bit is "0" is barred. Accordingly, the semiconductor memory device functions as the "address-based partially good product".

If the semiconductor memory device functions as the "bank-based partially good product", the anti-fuse corresponding to the control signal TAFBA1H or the anti-fuse corresponding to the control signal TAFBA1L is programmed depending on a position of a defective bit which is obtained in a test. By this, the internal bank address signal IBA1 is fixed at "High" or "Low" and thus the uppermost bit of the bank address is fixed at "0" or "1". When the uppermost bit of the bank address is fixed at "0", access to banks 2 and 3 is barred. Similarly, when the uppermost bit of the bank address is fixed at "1", access to banks 0 and 1 is barred. Accordingly, the semiconductor memory device functions as the "bank-based partially good product".

Note that programming of one of the anti-fuses corresponding to the control signals TAFA13H and TAFA13L and programming of one of the anti-fuses corresponding to the control signals TAFBA1H and TAFBA1L allow the semiconductor memory device to function as the "address-based partially good product" and as the "bank-based partially good product".

(Configuration and Operation of DQ Switching Circuit)

In this embodiment, the DQ switching circuit 26 fixes control signals supplied to the data control circuit 15, the latch circuit 16 and the data input/output buffer 17 depending on the state of the anti-fuses integrated in the anti-fuse circuit 27, and thereby the semiconductor memory device of this embodiment functions as the "DQ-based partially good product". Note that in this embodiment, the "DQ-based partially good product" is not provided by fixing the internal address signals.

More specifically, the DQ switching circuit 26 receives control signals /LDQ_EN and /UDQ_EN from the anti-fuse circuit 27 and fixes control signals supplied to the data control circuit 15, the latch circuit 16 and the data input/output buffer 17 in response to the control signals /LDQ_EN and /UDQ_EN. Each of the control signals /LDQ_EN and /UDQ_EN is a signal generated depending on the state of the integrated anti-fuses. More specifically, the control signals /LDQ_EN and /UDQ_EN are set to "Low" by default. The control signal /LDQ_EN is pulled up to "High" when the corresponding anti-fuse is programmed. When the control signal /LDQ_EN is pulled up to "High", the DQ switching circuit 26 fixes the control signal, which is used to control inputting/outputting from/to the lower data input/output terminals DQ0 to DQ7 and included in control signals supplied to the data control circuit 15 and the latch circuit 16, at "Low", and further fixes the lower data strobe signal UDQS supplied to the latch circuit 16 and the data input/output buffer 17 at "Low", respectively By this, the function of a portion of the data control circuit 15, the latch circuit 16 and the data input/output buffer 17 corresponding to the lower data input/output terminals DQ0 to DQ7 are stopped, and the lower data input/output terminals DQ0 to DQ7 are disabled. Similarly, when the control signal /UDQ_EN is pulled up to "High", the DQ switching circuit 26 fixes the control signal, which is used to control the input/output from/to the upper data input/output terminals DQ8 to DQ15 and included in the control signals supplied to the data control circuit 15 and latch circuit 16, at "Low", and further fixes the upper data strobe signal UDQS supplied to the latch circuit 16 and the data input/output buffer 17 at "Low". By this, the f function of a portion of the data control circuit 15, the latch circuit 16 and the data input/output buffer 17 corresponding to the upper data input/output terminals DQ8 to DQ15 are stopped, and the upper data input/output terminals DQ8 to DQ15 are disabled.

Figure 6:
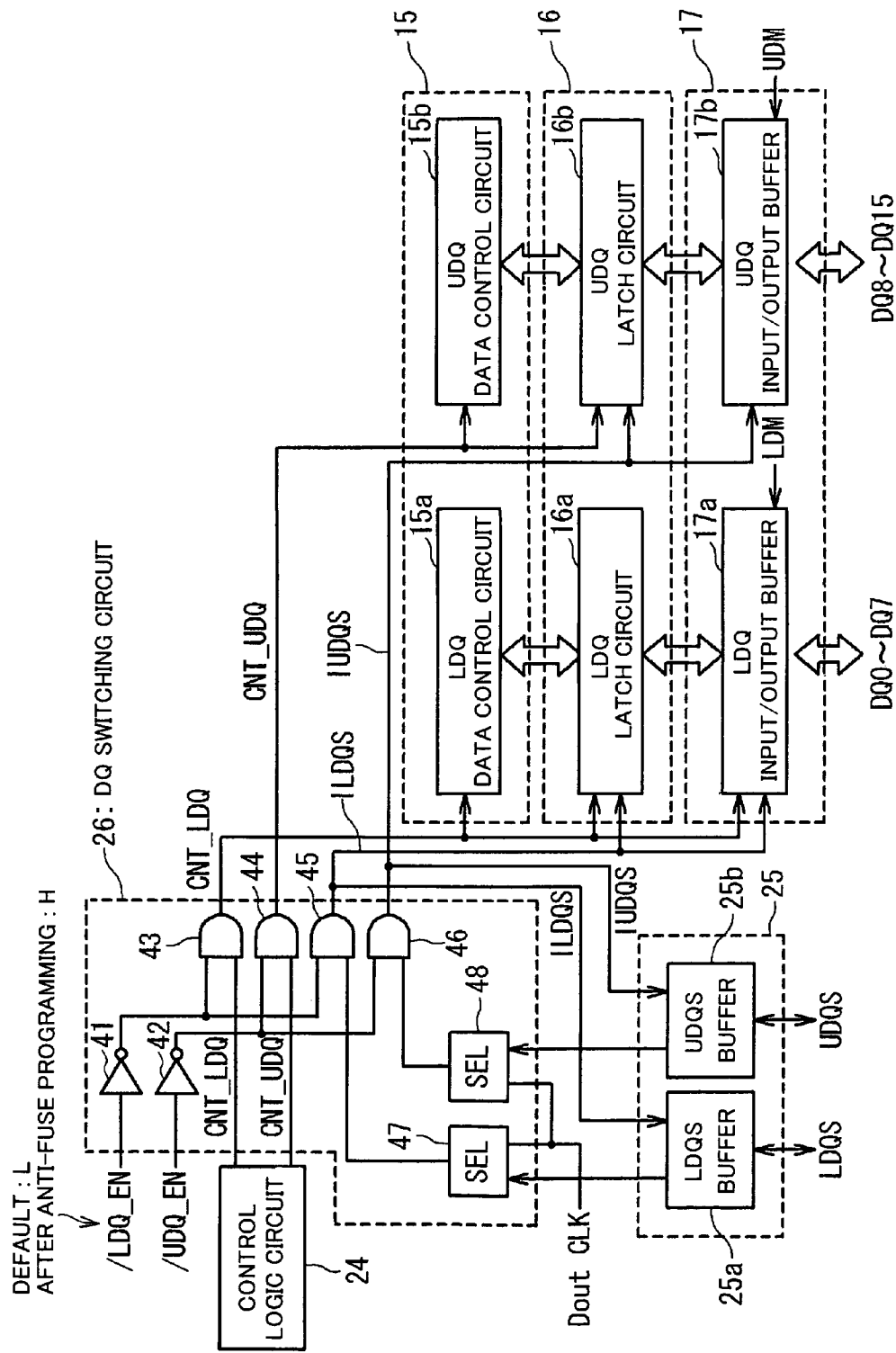
FIG. 6 is a circuit diagram showing a configuration of a DQ switching circuit, a data control circuit, a latch circuit and a data input/output buffer.

FIG. 6 is a circuit diagram showing an example of the configuration of the data control circuit 15, the latch circuit 16, the data input/output buffer 17, the DQS buffer 25 and the DQ switching circuit 26. The data control circuit 15 is composed of an LDQ data control circuit 15a which handles lower data (corresponding to the data input/output terminals DQ0 to DQ7) and a UDQ data control circuit 15b which handles upper data (corresponding to the data input/output terminals DQ8 to DQ15). The latch circuit 16 is composed of an LDQ latch circuit 16a which handles lower data and a UDQ latch circuit 16b which handles upper data. The data input/output buffer 17 is composed of an LDQ input/output buffer 17a which handles lower data and a UDQ input/output buffer 17b which handles upper data. The DQS buffer 25 is composed of an LDQS buffer 25a for inputting and outputting the lower data strobe signal LDQS and a UDQS buffer 25b for inputting and outputting the upper data strobe signal UDQS.

With this configuration, the data control circuit 15, the latch circuit 16 and the data input/output buffer 17 can handle the upper data and the lower data separately. During the write operation, the LDQ input/output buffer 17a receives lower data of write data, which is input to the data input/output terminals DQ0 to DQ7, while the UDQ input/output buffer 17b receives upper data thereof which is input to the data input/output terminals DQ8 to DQ15. The LDQ latch circuit 16a latches the lower data received by the LDQ input/output buffer 17a, while the UDQ latch circuit 16b latches the lower data received by the UDQ input/output buffer 17b. The LDQ data control circuit 15a transfers the lower data latched in the LDQ latch circuit 16a to the memory cell array 11 of a desired bank, while the UDQ data control circuit 15b transfers the upper data latched in the UDQ latch circuit 16b to the memory cell array 11 of the desired bank. During the read operation, the LDQ data control circuit 15a receives lower data from the memory cell array 11 of a selected bank, while the UDQ data control circuit 15b receives upper data from the memory cell array 11 of the selected bank. The LDQ latch circuit 16a latches the lower data received by the LDQ data control circuit 15a, while the UDQ latch circuit 16b latches the lower data received by the UDQ data control circuit 15b. The LDQ input/output buffer 17a outputs the lower data latched by the LDQ latch circuit 16a to the outside through the data input/output terminals DQ0 to DQ7.

The LDQ data control circuit 15a and the LDQ latch circuit 16a, which handle the lower data, operate in response to a control signal LDQ_CNT. Note that although only one control signal LDQ_CNT is shown in FIG. 6, actually a large number of control signals LDQ_CNT are present. A clock signal is an example of the control signal LDQ_CNT. Similarly, the UDQ data control circuit 15*b* and the UDQ latch circuit 16*b*, which handle the upper data, operate in response to a control signal UDQ_CNT.

In addition, the LDQ latch circuit 16*a* and the LDQ input/output buffer 17*a* operate in response to an internal lower data strobe signal ILDQS, while the UDQ latch circuit 16*b* and the UDQ input/output buffer 17*b* operate in response to an internal upper data strobe signal IUDQS. The internal lower data strobe signal ILDQS is a signal which is generated in the semiconductor memory device to control operation timings of the LDQ latch circuit 16*a* and the LDQ input/output buffer 17*a*. The internal upper data strobe signal IUDQS is a signal which is generated in the semiconductor memory device to control operation timings of the UDQ latch circuit 16*b* and the UDQ input/output buffer 17*b*.

The DQ switching circuit 26 includes inverters 41 and 42, AND gates 43 to 46 and selectors 47 and 48. The inverters 41 and 42 invert the control signals /LDQ_EN and /UDQ_EN received from the anti-fuse circuit 27.

The AND gate 43 outputs the logical product of the control signal LDQ_CNT received from the control logic circuit 24 and an output signal of the inverter 41. It should be understood that, although only one AND gate 43 is shown in FIG. 6, the AND gate 43 is provided for each of the control signals LDQ_CNT, and each AND gate 43 outputs the logical product of the corresponding control signal LDQ_CNT and the output signal of the inverter 41.

Similarly, the AND gate 44 outputs the logical product of the control signal UDQ_CNT received from the control logic circuit 24 and an output signal of the inverter 42. It should be understood that, although only one AND gate 44 is shown, the AND gate 44 is provided for each of the control signals UDQ_CNT, and each AND gate 44 outputs the logical product of the corresponding control signal UDQ_CNT and the output signal of the inverter 42.

An output signal of the LDQS buffer 25*a* is supplied to a first input of the selector 47, while a clock DoutCLK is supplied to a second input thereof. Similarly, an output signal of the UDQS buffer 25*b* is supplied to a first input of the selector 48, while a clock DoutCLK is supplied to a second input thereof.

The selectors 47 and 48 have a function of switching signals serving as sources of the internal lower data strobe signal ILDQS and the internal upper data strobe signal IUDQS. During the read operation, the selectors 47 and 48 select the output clock DoutCLK, and the internal lower data strobe signal ILDQS and the internal upper data strobe signal IUDQS are generated from the output clock DoutCLK. The generated internal lower data strobe signal ILDQS and the internal upper data strobe signal IUDQS are used for timing control of the latch circuit 16 and the data input/output buffer 17, and are output as the lower data strobe signal LDQS and the upper data strobe signal UDQS from the DQS buffer 25. During the write operation, the selectors 47 and 48 select signals output from the LDQS buffer 25*a* and the UDQS buffer 25*b*, i.e., the lower data strobe signal LDQS and the upper data strobe signal UDQS supplied from the external device. In this case, the internal lower data strobe signal ILDQS and the internal upper data strobe signal IUDQS are generated from the lower data strobe signal LDQS and the upper data strobe signal UDQS.

Further, the AND gate 45 outputs the logical product of an output signal of the selector 47 and the output signal of the inverter 41, while the AND gate 46 outputs the logical product of an output signal of the selector 48 and the output signal of the inverter 42. As will be described later, the AND gates 45 and 46 have a function for fixing the internal lower data strobe signal ILDQS and the internal upper data strobe signal IUDQS in response to the control signals /LDQ_EN and /UDQ_EN.

If the semiconductor memory device functions as the "DQ-based partially good product", the anti-fuse corresponding to the control signal /LDQ_EN or the anti-fuse corresponding to the control signal /UDQ_EN is programmed depending on a position of a defective bit. When the anti-fuse corresponding to the control signal /LDQ_EN is programmed, the control signal /LDQ_EN changes to "High", and the output from the inverter 41 changes to "Low". Accordingly, outputs of the AND gates 43 and 45 are fixed at "Low". In other words, the signal levels of the control signals LDQ_CNT and the internal lower data strobe signal ILDQS are fixed at "Low". By this, the semiconductor memory device functions as the "DQ-based partially good product" with the lower data input/output terminals DQ0 to DQ7 disabled. That is, the semiconductor memory device is set such that the LDQ input/output buffer 17*a* does not input or output data and the LDQS buffer 25*a* does not output the lower data strobe signal LDQS.

On the other hand, when the anti-fuse corresponding to the control signal /UDQ_EN is programmed, the control signal /UDQ_EN changes to "High", and the output from the inverter 42 changes to "Low". Accordingly, outputs from the AND gates 44 and 46 are fixed at "Low". In other words, the signal levels of the control signals UDQ_CNT and the internal upper data strobe signal IUDQS are fixed at "Low". By this, the semiconductor memory device functions as the "DQ-based partially good product" with the upper data input/output terminals DQ8 to DQ15 disabled. That is, the semiconductor memory device is set such that the UDQ input/output buffer 17*b* does not input or output data and the UDQS buffer 25*b* does not output the upper data strobe signal UDQS.

(Configuration and Operation of Anti-Fuse Circuit)

FIG. 7 is a block diagram showing an example of the configuration of the anti-fuse circuit 27 for generating the control signals TAFA13H, TAFA13L, TAFBA1H, TAFBA1L, /LDQ_EN, and /UDQ_EN described above. Note that one set of circuits shown in FIG. 7 is used to generate each of the control signals TAFA13H, TAFA13L, TAFBA1H, TAFBA1L, /LDQ_EN, and /UDQ_EN.

In an example, the anti-fuse circuit 27 includes a latch circuit 51, a breakdown voltage applying circuit 52, an anti-fuse 53, a select transistor 54, and a determination circuit 55. The anti-fuse 53 is composed of a capacitor-connected MOS transistor. A junction X connected to the anti-fuse 53 is kept at "High" by default. When the anti-fuse 53 is programmed (i.e., broken), the level at the junction X changes to "Low". The anti-fuse 53 can hold 1-bit data represented by its state.

The latch circuit 51 latches data for giving an instruction to break the anti-fuse 53 or leave it unbroken when the anti-fuse 53 is to be programmed. During normal use, the latch circuit 51 functions as a circuit which latches data held in the anti-fuse 53 recognized by the determination circuit 55. The control signals TAFA13H, TAFA13L, TAFBA1H, TAFBA1L, /LDQ_EN and /UDQ_EN described above are output from the latch circuits 51.

The breakdown voltage applying circuit 52 applies a breakdown voltage for breaking the anti-fuse 53 to the anti-fuse 53 at the time of programming the anti-fuse 53.

The select transistor 54 connects the junction X and the input of the determination circuit 55 in response to a select signal SEL.

The determination circuit 55 is a circuit for determining whether the anti-fuse 53 is broken. The determination circuit 55 compares the potential at the junction X connected to the anti-fuse 53 with a reference potential and determines whether the anti-fuse 53 is broken. An output from the determination circuit 55 is at "High" when the anti-fuse 53 is broken and is at "Low" when the anti-fuse 53 is broken.

The control signals TAFA13H, TAFA13L, TAFBA1H, TAFBA1L, /LDQ_EN and /UDQ_EN are generated by the anti-fuse circuit 27 with the above-described configuration and are used to cause the semiconductor memory device of this embodiment to function as the "address-based partially good product", the "bank-based partially good product", and/or the "DQ-based partially good product".

As has been described above, the semiconductor memory device of this embodiment functions as the "address-based partially good product", the "bank-based partially good product", and/or the "DQ-based partially good product" by programming the anti-fuses. Since the anti-fuses can be programmed even after an assembly process, it is possible to recover the semiconductor memory device of this embodiment into the "address-based partially good product", the "bank-based partially good product", and/or the "DQ-based partially good product" by programming an appropriate anti-fuse if a defect is detected by a screening test after the assembly process.

Although the semiconductor memory device of this embodiment is configured such that the internal address signal can be fixed, instead or in addition, another internal address signal can be fixed depending on the state of the anti-fuses. Also, although the semiconductor memory device of this embodiment is configured such that the internal bank address signal IBA1 can be fixed, instead or in addition, the internal bank address signal IBA0 can be fixed depending on the state of the anti-fuses.

Further, although the semiconductor memory device of this embodiment is configured such that the lower data input/output terminals DQ0 to DQ7 or the upper data input/output terminals DQ8 to DQ15 can be disabled depending on the state of the anti-fuses, it is possible to appropriately change data input/output terminals capable of being disabled based on the state of each of the anti-fuses. For example, the semiconductor memory device of this embodiment may be configured such that the data input/output terminals DQ0 to DQ3, DQ4 to DQ7, DQ8 to DQ11, and DQ12 to DQ15 can be separately disabled depending on the state of the anti-fuses.

The present invention is not limited to the above described embodiments, and various variations and modifications may be possible without departing from the scope of the present invention.

This application is based on the Japanese Patent application No. 2007-031782 filed on Feb. 13, 2007, entire content of which is expressly incorporated by reference herein.

What is claimed is:

1. A semiconductor memory device, comprising:
an anti-fuse;
a memory circuit including memory cells; and
a peripheral circuit configured to access only an area of said memory circuit selected depending on a state of said anti-fuse,
wherein said peripheral circuit includes an input buffer for generating an internal address signal based on an external address signal supplied from outside and selects a memory cell to be accessed in said memory circuit in response to the internal address signal,
and the input buffer fixes a value of the internal address signal depending on the state of said anti-fuse.

2. The semiconductor memory device according to claim 1, wherein the input buffer fixes a row address of the memory cell array to fix the value of the internal address signal depending on the state of said anti-fuse.

3. A semiconductor memory device, comprising:
an anti-fuse;
a memory circuit including memory cells; and
a peripheral circuit configured to access only an area of said memory circuit selected depending on a state of said anti-fuse,
wherein said memory circuit includes a plurality of banks,
said peripheral circuit includes an input buffer for generating an internal bank address signal based on an external bank address signal supplied from outside and selects a bank to be accessed among the plurality of banks in response to the internal bank address signal,
and the input buffer fixes a value of the internal bank address signal depending on the state of said anti-fuse.

4. A semiconductor memory device, comprising:
an anti-fuse;
a memory circuit including memory cells;
a peripheral circuit configured to access only an area of said memory circuit selected depending on a state of said anti-fuse;
a plurality of data input/output terminals,
wherein said peripheral circuit includes:
a write/read circuit for sending write data from the plurality of data input/output terminals to said memory circuit and sending read data from said memory circuit to the plurality of data input/output terminals respectively in response to a first control signal and a second control signal; and
a switching circuit,
a portion of the write/read circuit corresponding to a first data input/output terminal of the plurality of the input/output terminals operates in response to the first control signal and a portion of the write/read circuit corresponding to a second data input/output terminal of the plurality of the input/output terminals operates in response to the second control signal,
and the switching circuit fixes a value of the first control signal or the second control signal depending on the state of said anti-fuse.

5. A semiconductor device comprising:
an anti-fuse element taking one of first and second states;
a memory circuit comprising a plurality of memory cells, each of the memory cells being accessed in response to a corresponding one of logic combinations of internal address bits; and
a peripheral circuit receiving external address bits and controlling the logic combinations of the internal address bits, such that when the anti-fuse element takes the first state, each of the internal address bits is determined in logic level by an associated one of the external bits, and when the anti-fuse element takes the second state, at least one of the internal address bits is fixed at a predetermined logic level irrespective of a logic level of an associated one of the external address bits and remaining ones of the internal address bits are determined by logic levels of remaining ones of the external address bits.

6. The semiconductor device according to claim 5, wherein the internal address bits include internal row address bits and the at least one of the internal address bits includes at least one of the internal row address bits.

7. The semiconductor device according to claim 6, wherein the at least one of internal row address bits includes a most significant bit of the internal row address bits.

8. The semiconductor device according to claim 5, wherein the internal address bits include internal bank address bits and the at least one of the internal address bits includes at least one of the internal bank address bits.

* * * * *